(12) United States Patent
Dong et al.

(10) Patent No.: US 11,199,719 B2
(45) Date of Patent: Dec. 14, 2021

(54) SYSTEM AND METHOD FOR QUALIFYING A MULTI-LAYERED OPTICAL STACK FOR AN OPTICAL PROJECTION SYSTEM

(71) Applicant: MAGIC LEAP, INC., Plantation, FL (US)

(72) Inventors: Huihang Dong, Weston, FL (US); Wendong Xing, Plantation, FL (US); Thomas Mercier, Weston, FL (US); Ryan Rieck, Plantation, FL (US); Robert D. Tekolste, Fort Lauderdale, FL (US); William Hudson Welch, Fort Lauderdale, FL (US)

(73) Assignee: Magic Leap, Inc., Plantation, FL (US)

( * ) Notice: Subject to any disclaimer, the term of this patent is extended or adjusted under 35 U.S.C. 154(b) by 0 days.

(21) Appl. No.: 17/251,730

(22) PCT Filed: Jun. 10, 2019

(86) PCT No.: PCT/US2019/036380
§ 371 (c)(1),
(2) Date: Dec. 11, 2020

(87) PCT Pub. No.: WO2019/241149
PCT Pub. Date: Dec. 19, 2019

(65) Prior Publication Data
US 2021/0215943 A1  Jul. 15, 2021

Related U.S. Application Data

(60) Provisional application No. 62/684,568, filed on Jun. 13, 2018.

(51) Int. Cl.
*G02B 27/18* (2006.01)
*G02B 1/10* (2015.01)
(Continued)

(52) U.S. Cl.
CPC .............. *G02B 27/18* (2013.01); *G02B 1/10* (2013.01); *G03F 7/0002* (2013.01); *B81C 1/0046* (2013.01)

(58) Field of Classification Search
CPC ......... G02B 27/18; G02B 1/10; G03F 7/0002; G03F 7/70516; G03F 7/70775;
(Continued)

(56) References Cited

U.S. PATENT DOCUMENTS 5,117,255 A  5/1992  Shiraishi et al.
6,242,754 B1  6/2001  Shiraishi
(Continued)

OTHER PUBLICATIONS

International Search Report and Written Opinion in related International Application No. PCT/US2019/036380, dated Aug. 29, 2019, 17 pages.

*Primary Examiner* — Mustak Choudhury
(74) *Attorney, Agent, or Firm* — Fish & Richardson P.C.

(57) ABSTRACT

Methods and systems for qualifying a multi-layered optical stack include providing the multi-layered optical stack including a first optical layer and a second optical layer. The first optical layer includes a first pair of fiducial marks and the second optical layer includes a second pair of fiducial marks Each of the first pair are spaced laterally from each of the second pair such that the first pair and the second pair are visible through the optical stack. A first angle defined between a first reference line connecting the first pair and a global reference line is determined. A second angle defined between a second reference line connecting the second pair and the global reference line is determined. The multi-layered optical stack is qualified for use in the optical projection system based on whether a difference between the first angle and the second angle is less than a predetermined threshold.

18 Claims, 12 Drawing Sheets

(51) Int. Cl.
*G03F 7/00* (2006.01)
*B81C 1/00* (2006.01)

(58) Field of Classification Search
CPC . G03F 9/00; G03F 9/70; G03F 9/7049; G03F 9/7076; G03F 9/7046; G03F 9/7092; G03F 9/7088; G03F 9/7084; G03F 9/70458; G03F 9/70258; G03F 9/70241; B81C 1/0046
See application file for complete search history.

(56) References Cited

U.S. PATENT DOCUMENTS

| | | |
|---|---|---|
| 8,736,636 B2 | 5/2014 | Kang |
| 8,793,770 B2 | 7/2014 | Lim |
| 8,823,855 B2 | 9/2014 | Hwang |
| 8,874,673 B2 | 10/2014 | Kim |
| 2004/0021254 A1* | 2/2004 | Sreenivasan ........ B29C 35/0888 264/406 |
| 2005/0189502 A1* | 9/2005 | Van Bilsen ........... G03F 9/7049 250/559.3 |
| 2009/0059194 A1 | 3/2009 | Kanaya |

* cited by examiner

900

Provide, using a processor, a multi-layered optical stack including a first optical layer and a second optical layer, the first optical layer including a first pair of fiducial marks and the second optical layer including a second pair of fiducial marks, each of the first pair of fiducial marks spaced laterally from each of the second pair of fiducial marks such that the first pair and the second pair are visible through the optical stack
904

Determine, using the processor, i) a first angle defined between a first reference line connecting the first pair of fiducial marks and a global reference line, and ii) a second angle defined between a second reference line connecting the second pair of fiducial marks and the global reference line
908

Compare the first angle with the second angle
912

Qualify the multi-layered optical stack for use in the optical projection system based on whether a difference between the first angle and the second angle is less than a predetermined threshold
916

FIG. 9

SYSTEM AND METHOD FOR QUALIFYING A MULTI-LAYERED OPTICAL STACK FOR AN OPTICAL PROJECTION SYSTEM

CROSS-REFERENCE TO RELATED APPLICATIONS

This application is a U.S. National Stage Application under 35 USC § 371 and claims the benefit of International Patent Application No. PCT/US2019/036380 filed on Jun. 10, 2019, which claims the benefit of U.S. Provisional Application 62/684,568, filed on Jun. 13, 2018. Each of the foregoing applications are hereby incorporated by reference in their entirety.

TECHNICAL FIELD

This disclosure relates to qualifying a multi-layered optical stack for an optical projection system.

BACKGROUND

Nanofabrication can include the fabrication of structures that have features on the order of 100 nanometers or smaller. One application in which nanofabrication has had a sizeable impact is in the formation of optically stacked structures. However, increasing the throughput of a nanofabrication process, and minimizing the process cost and complexity can pose challenges. Moreover, achieving a desired alignment between layers of a stacked optical structure can be a problem.

SUMMARY

Innovative aspects of the subject matter described in this specification may be embodied in methods of qualifying a multi-layered optical stack for an optical projection system. The methods include providing the multi-layered optical stack including a first optical layer and a second optical layer. The first optical layer includes a first pair of fiducial marks and the second optical layer includes a second pair of fiducial marks. Each of the first pair of fiducial marks is spaced laterally from each of the second pair of fiducial marks such that the first pair and the second pair are visible through the optical stack. The processor determines i) a first angle defined between a first reference line connecting the first pair of fiducial marks and a global reference line, and ii) a second angle defined between a second reference line connecting the second pair of fiducial marks and the global reference line. The processor determines whether a difference between the first angle and the second angle is less than a predetermined threshold. The processor qualifies the multi-layered optical stack for use in the optical projection system responsive to the difference between the first angle and the second angle being less than the predetermined threshold.

Other embodiments of these aspects include corresponding systems and apparatus. These and other embodiments may each optionally include one or more of the following features. For example, the qualifying of the multi-layered optical stack for use in the optical projection system includes determining, using the processor, that the first optical layer and the second optical layer are rotationally aligned responsive to the difference between the first angle and the second angle being less than the predetermined threshold. The processor qualifies the multi-layered optical stack for use in the optical projection system responsive to the determining that the first optical layer and the second optical layer are rotationally aligned.

In other embodiments, the processor terminates the qualifying of the multi-layered optical stack for use in the optical projection system responsive to the difference between the first and the second angle being greater than the predetermined threshold.

In other embodiments, the processor determines that the first optical layer and the second optical layer are rotationally unaligned responsive to the difference between the first angle and the second angle being greater than the predetermined threshold. The processor terminates the qualifying of the multi-layered optical stack responsive to the determining that the first optical layer and the second optical layer are rotationally unaligned.

In other embodiments, the first pair and the second pair of fiducial marks are non-overlapping along a direction transverse to a plane defined by the first optical layer.

In other embodiments, the first optical layer and the second optical layer are optically transparent.

In other embodiments, the processor determines a respective position of each fiducial mark of the first pair of fiducial marks along a first axis and a second axis. The second axis is orthogonal to the first axis. The processor compares i) a first position of a first fiducial mark of the first pair of fiducial marks along the first axis and the second axis to a first expected position of the first fiducial mark of the first pair of fiducial marks along the first axis and the second axis, respectively, and ii) a second position of a second fiducial mark of the first pair of fiducial marks along the first axis and the second axis to a second expected position of the second fiducial mark of the first pair of fiducial marks along the first axis and the second axis, respectively. Based on the comparing, the processor determines whether the first optical layer is translationally aligned responsive to a difference between the respective position of each fiducial mark of the first pair of fiducial marks along each axis being less than a threshold difference with respect to the respective expected position of each fiducial mark of the first pair of fiducial marks along each axis. The processor qualifies the multi-layered optical stack for use in the optical projection system responsive to determining that the first optical layer is translationally aligned.

In other embodiments, the first optical layer includes a first triplet of fiducial marks and the second optical layer includes a second triplet of fiducial marks. The first triplet includes the first pair of fiducial marks and the second triplet includes the second pair of fiducial marks. The processor determines i) a first plane defined by the first optical layer based on the first triplet of fiducial marks, and ii) a second plane defined by the second optical layer based on the second triplet of fiducial marks. The processor determines a distance between the first plane and the second plane at a plurality of points between the first plane and the second plane. The processor determines that the first optical layer is substantially parallel to the second optical layer responsive to the distance between the first plane and the second plane being substantially the same at a threshold number of points.

In other embodiments, the multi-layered optical stack further includes a third optical layer including a third pair of fiducial marks. The processor determines a third angle defined between a third reference line connecting the third pair of fiducial marks and the global reference line. The processor determines whether a difference between any two of the first angle, the second angle, and the third angle is less than the predetermined threshold. The processor qualifies the multi-layered optical stack for use in the optical projection system responsive to the difference between any two of the first angle, the second angle, and the third angle being less than the predetermined threshold.

In other embodiments, the qualifying of the multi-layered optical stack for use in the optical projection system includes determining, using the processor, that the first optical layer, the second optical layer, and the third optical layer are rotationally aligned responsive to the difference between any two of the first angle, the second angle, and the third angle being less than the predetermined threshold. The processor qualifies the multi-layered optical stack responsive to determining that the first optical layer, the second optical layer, and the third optical layer are rotationally aligned.

In other embodiments, the processor terminates the qualifying of the multi-layered optical stack for use in the optical projection system responsive to the difference between any two of the first angle, the second angle, and the third angle being greater than the predetermined threshold.

In other embodiments, the processor determines that the first optical layer and the third optical layer are rotationally unaligned responsive to a difference between the first angle and the third angle being greater than the predetermined threshold. The processor terminates the qualifying of the multi-layered optical stack for use in the optical projection system responsive to the determining that the first optical layer and the third optical layer are rotationally unaligned.

Innovative aspects of the subject matter described in this specification may be embodied in a system for qualifying a multi-layered optical stack for an optical projection system. The system includes a light source configured to illuminate the multi-layered optical stack including a first optical layer and a second optical layer. The first optical layer includes a first pair of fiducial marks and the second optical layer includes a second pair of fiducial marks. Each of the first pair of fiducial marks is spaced laterally from each of the second pair of fiducial marks such that the first pair and the second pair are visible through the optical stack. A microscope is configured to detect the first pair and the second pair of fiducial marks illuminated by the light source. A processor is configured, based on the detection of the first pair and the second pair of fiducial marks, to determine i) a first angle defined between a first reference line connecting the first pair of fiducial marks and a global reference line, and ii) a second angle defined between a second reference line connecting the second pair of fiducial marks and the global reference line. The processor determines whether a difference between the first angle and the second angle is less than a predetermined threshold. The processor qualifies the multi-layered optical stack for use in the optical projection system responsive to the difference between the first angle and the second angle being less than the predetermined threshold.

Innovative aspects of the subject matter described in this specification may be embodied in a multi-layered optical stack qualified for an optical projection system. The multi-layered optical stack includes a first optical layer including a first pair of fiducial marks. A second optical layer includes a second pair of fiducial marks. Each of the first pair of fiducial marks is spaced laterally from each of the second pair of fiducial marks such that the first pair and the second pair of fiducial marks are visible through the optical stack. The multi-layered optical stack is qualified for use in the optical projection system responsive to a difference between a first angle and a second angle being less than a predetermined threshold. The first angle is defined between a first reference line connecting the first pair of fiducial marks and a global reference line. The second angle is defined between a second reference line connecting the second pair of fiducial marks and the global reference line.

Particular implementations of the subject matter described in this specification can be implemented so as to realize one or more of the following advantages. For instance, alignment of the optical layers of a multi-layered optical stack reduces light artifacts and ghosting effects of the optical stack.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

FIG. 9 illustrates an example method for qualifying a multi-layered optical stack for an optical projection system

DETAILED DESCRIPTION

This document describes methods and systems for qualifying a multi-layered optical stack for an optical projection system. The methods include providing the multi-layered optical stack including a first optical layer and a second optical layer. The first optical layer includes a first pair of fiducial marks and the second optical layer includes a second pair of fiducial marks. Each of the first pair of fiducial marks is spaced laterally from each of the second pair of fiducial marks such that the first pair and the second pair are visible through the optical stack. The processor determines i) a first angle defined between a first reference line connecting the first pair of fiducial marks and a global reference line, and ii) a second angle defined between a second reference line connecting the second pair of fiducial marks and the global reference line. The processor determines whether a difference between the first angle and the second angle is less than a predetermined threshold. The processor qualifies the multi-layered optical stack for use in the optical projection system responsive to the difference between the first angle and the second angle being less than the predetermined threshold.

Example Lithographic System

Figure 1:
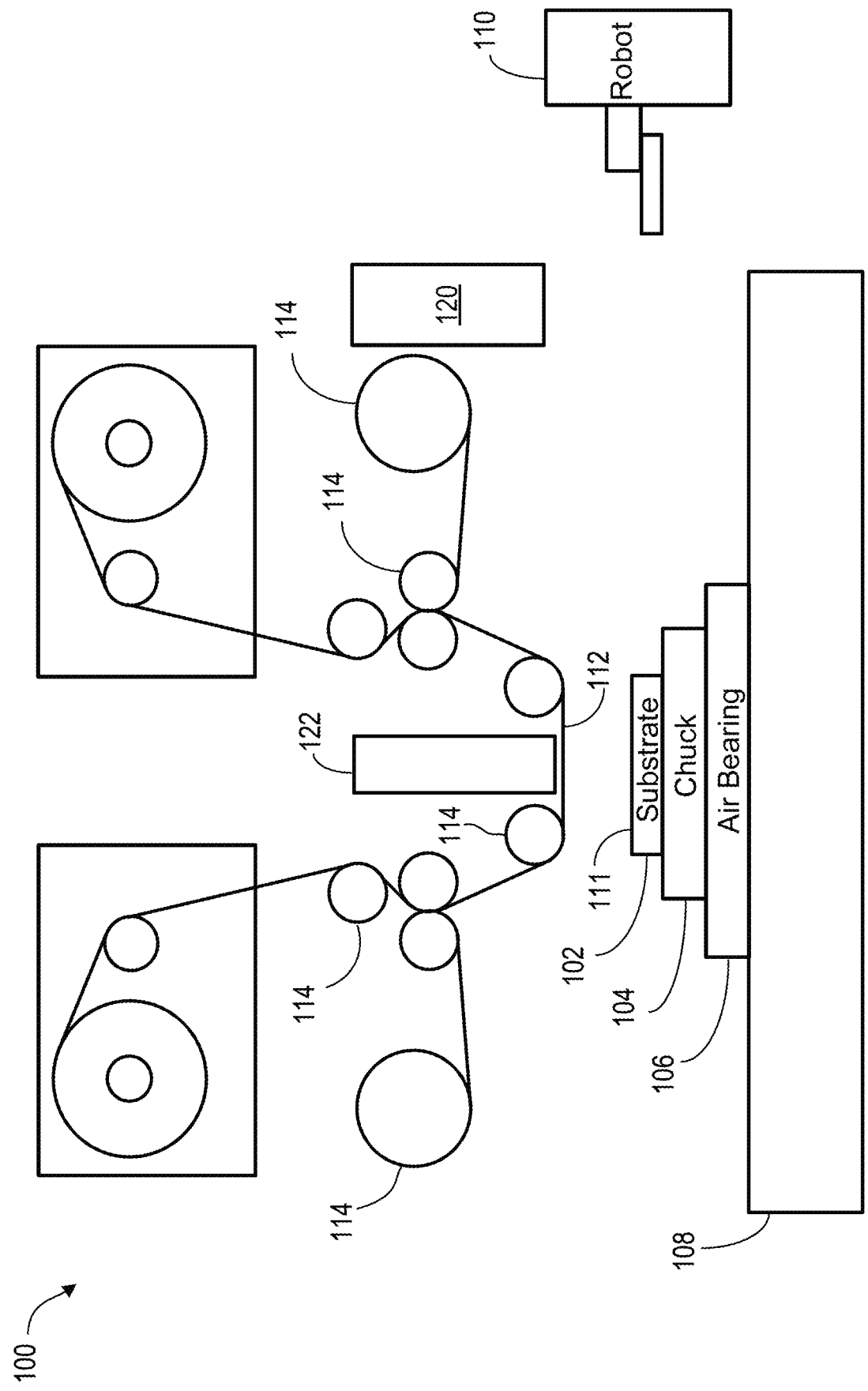
FIG. 1 illustrates an example side view of a lithographic system.

FIG. 1 illustrates an example side view of a lithographic system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. In some examples, the substrate 102 and the substrate chuck 104 may be further positioned on an air bearing 106. The air bearing 106 provides motion about the x-, y-, and/or z-axes. In some examples, the substrate 102 and the substrate chuck 104 are positioned on a base. The air bearing 106, the substrate 102, and the substrate chuck 104 may also be positioned on a stage 108. In some examples, a robotic system 110 positions the substrate 102 on the substrate chuck 104.

The imprint lithography system 100 further includes an imprint lithography flexible template 112 that is coupled to one or more rollers 114, depending on design considerations. The rollers 114 provide movement of a least a portion of the flexible template 112. Such movement may selectively provide different portions of the flexible template 112 in superimposition with the substrate 102. In some examples, the flexible template 112 includes a patterning surface that includes a plurality of features, e.g., spaced-apart recesses and protrusions. However, in some examples, other configurations of features are possible. The patterning surface may define any original pattern that forms the basis of a pattern 111 to be formed on substrate 102. In some examples, the flexible template 112 may be coupled to a template chuck, e.g., a vacuum chuck, a pin-type chuck, a groove-type chuck, an electromagnetic chuck, and/or the like.

The imprint lithography system 100 may further include a fluid dispense system 120. The fluid dispense system 120 may be used to deposit a polymerizable material on the substrate 102. The polymerizable material may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material is positioned upon the substrate 102 as a plurality of droplets.

Example Substrate Having Patterned Layer

Figure 2:
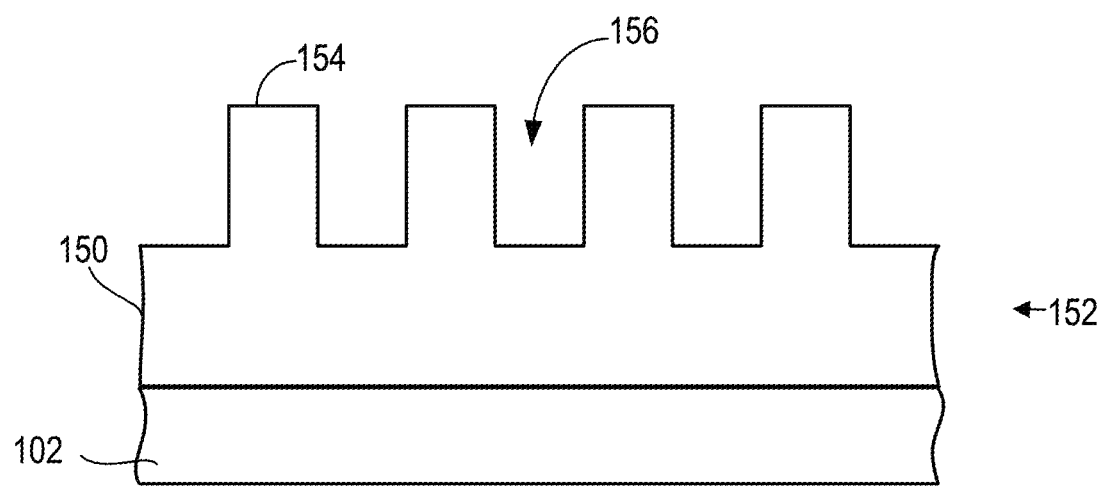
FIG. 2 illustrates an example side view of a substrate having a patterned layer positioned thereon.

FIG. 2 illustrates an example side view of a substrate 102 having a patterned layer 150 positioned thereon. Referring to FIGS. 1 and 2, the imprint lithography system 100 may further include an energy source 122 coupled to direct energy towards the substrate 102. In some examples, the rollers 114 and the air bearing 106 are configured to position a desired portion of the flexible template 112 and the substrate 102 in a desired positioning. The imprint lithography system 100 may be regulated by a processor in communication with the air bearing 106, the rollers 114, the fluid dispense system 120, and/or the energy source 122, and may operate on a computer readable program stored in a memory.

In some examples, the rollers 114, the air bearing 106, or both, vary a distance between the flexible template 112 and the substrate 102 to define a desired volume therebetween that is filled by the polymerizable material. For example, the flexible template 112 contacts the polymerizable material. After the desired volume is filled by the polymerizable material, the energy source 122 produces energy, e.g., broadband ultraviolet radiation, causing the polymerizable material to solidify and/or cross-link conforming to shape of a surface of the substrate 102 and a portion of the patterning surface of the flexible template 122, defining a patterned layer 150 on the substrate 102. In some examples, the patterned layer 150 includes a residual layer 152 and a plurality of features shown as protrusions 154 and recessions 156.

Example System for Qualifying Multi-Layered Optical Stack

Figure 3:
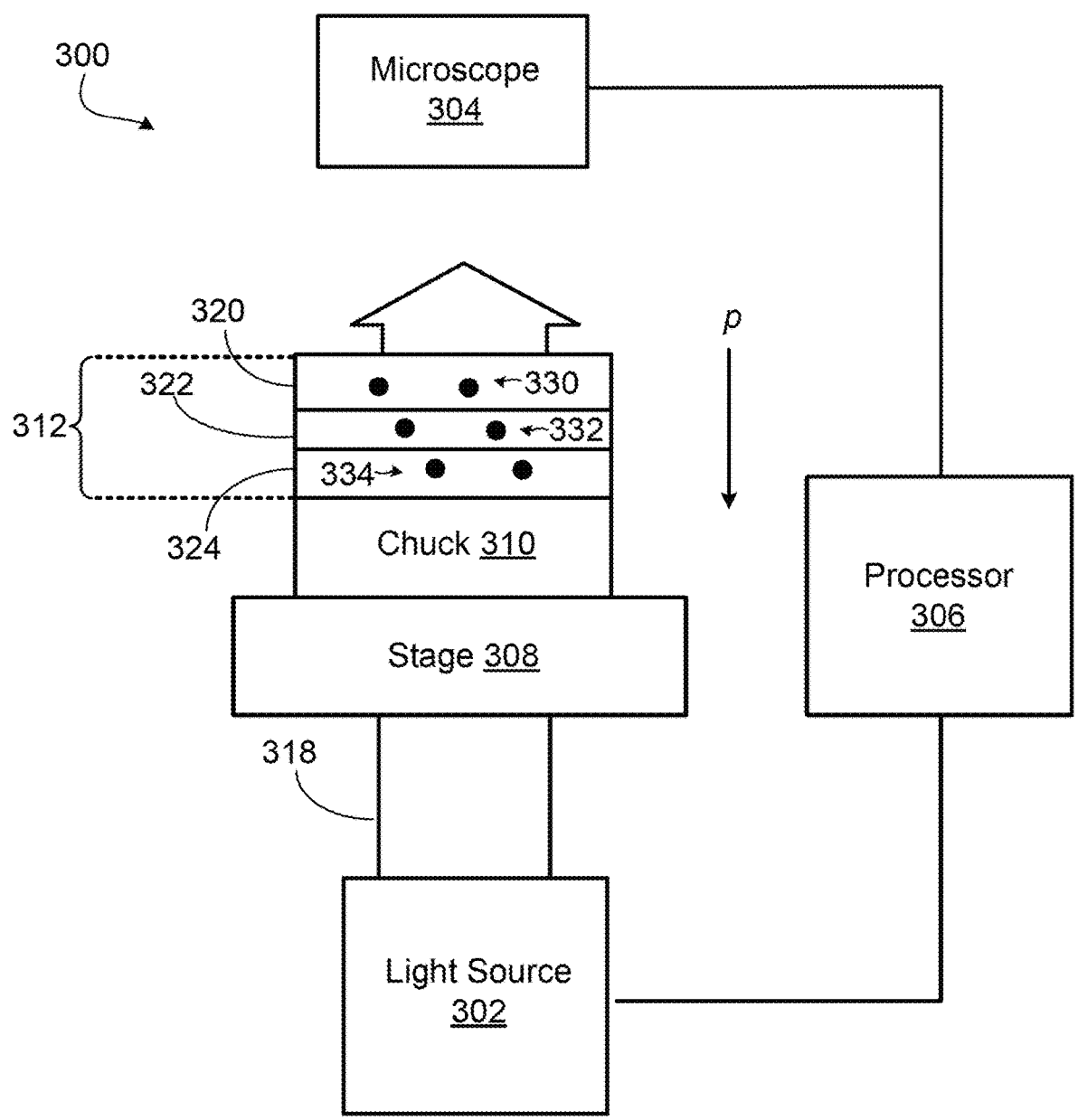
FIG. 3 illustrates an example system for qualifying a multi-layered optical stack for an optical projection system.

FIG. 3 illustrates an example system 300 for qualifying a multi-layered optical stack 312 for an optical projection system. The system 300 includes a light source 302, a microscope 304, a processor 306, a stage 308, a chuck 310, and a multi-layered optical stack 312. The stage 308 and the chuck 310 are similar to the stage 108 and the chuck 104 of FIG. 1. The optical stack 312 can be similar to the substrate 102 of FIG. 1. The processor 306 is in communication with each of the light source 302 and the microscope 304 to control operation thereof.

Qualifying of an optical device refers to the measurement and verification of optical parameters, physical characteristics, and the performance of the optical device. In one example, the system 300 qualifies the multi-layered optical stack 312 for use in an optical projection system by measuring and verifying a degree of alignment of optical layers of the multi-layered optical stack 312. The alignment of the optical layers relates to the performance of the multi-layered optical stack 312, such as the amount of unwanted light artifacts and/or ghosting.

In some embodiments, a method of qualifying the multi-layered optical stack 312 includes providing the multi-layered optical stack 312 including a first optical layer and a second optical layer. For example, the multi-layered optical stack 312 includes a first optical layer 320 and a second optical layer 322. The first optical layer 320 includes a first pair 330 of fiducial marks and the second optical layer 322 includes a second pair 332 of fiducial marks. Each of the first pair 330 of fiducial marks is spaced laterally from each of the second pair 332 of fiducial marks such that the first pair 330 and the second pair 332 are visible through the optical stack 312.

In some embodiments, the multi-layered optical stack 312 further includes a third optical layer including a third pair of fiducial marks. For example, the multi-layered optical stack 312 includes a first optical layer 320, a second optical layer 322, and a third optical layer 324. In other embodiments, the multi-layered optical stack 312 can include any number of optical layers. In some embodiments, the first optical layer 320 and the second optical layer 322 are optically transparent. For example, each of the optical layers 320, 322, 324 can be optically transparent layers. Optical transparency is a physical property of the optical layers that allows light to pass through the optical layers without substantial scattering. Optical transparency depends at least in part on an absence of structural defects (e.g., voids or cracks) and the molecular structure of the material of the optical layers. The first optical layer 320 can include a first pair 330 of fiducial marks, the second optical layer 322 can include a second pair 332 of fiducial marks, and the third optical layer 324 can include a third pair 334 of fiducial marks. In other embodiments, each optical layer can include any number of fiducial marks, and each layer can include a differing or same number of fiducial marks.

Referring to FIG. 3, the light source 302 is configured to illumine the multi-layered optical stack 312. For example, the light source 302 provides a beam 318 of light that can pass through the multi-layered optical stack 312 and is detectable by the microscope 304. The light source 302 can provide the beam 318 of light in response to a signal from the processor 306. The microscope 304 is configured to detect illumination of the optical stack 312 by the light source 302, and detect the pairs 330, 332, 334 of fiducial marks.

Optical Layers of an Optical Stack

Figure 4A:
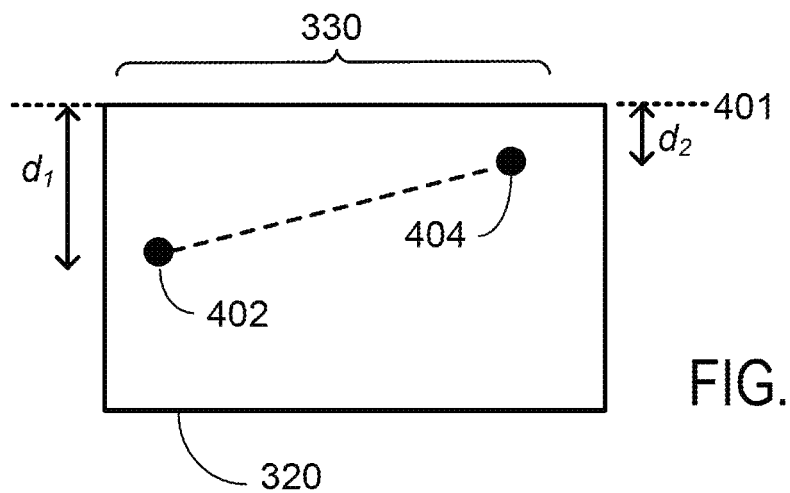
FIGS. 4A, 4B, 4C illustrate top down views of optical layers of the optical stack.

FIG. 4A illustrates a top down view of optical layers of the optical stack. Referring to FIG. 4A, a top down view of the first optical layer 320 is shown including the first pair 330 of fiducial marks. A first fiducial mark 402 of the first pair 330 is spaced a distance $d_1$ from a reference line 401 and a second fiducial mark 404 of the first pair 330 is spaced a distance $d_2$ from the reference line 401.

Figure 4B:
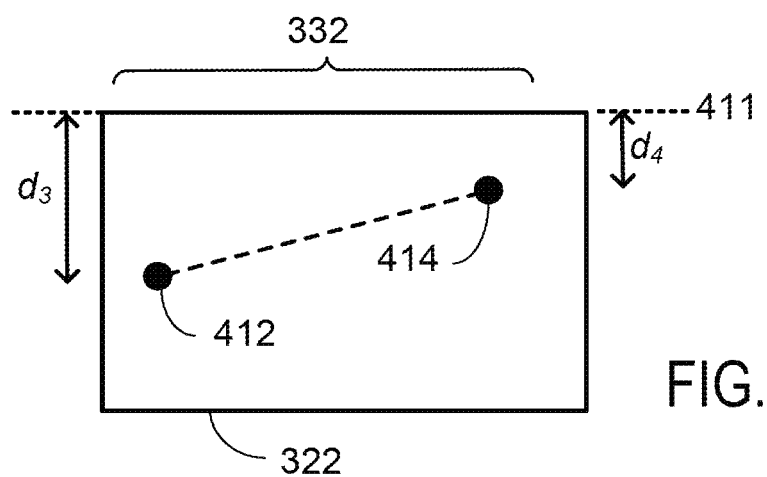

FIG. 4B illustrates a top down view of optical layers of the optical stack. Referring to FIG. 4B, a top down view of the second optical layer 322 is shown including the second pair 332 of fiducial marks. A first fiducial mark 412 of the second pair 332 is spaced a distance $d_3$ from a reference line 411 and a second fiducial mark 414 of the second pair 332 is spaced a distance $d_4$ from the reference line 411.

Figure 4C:
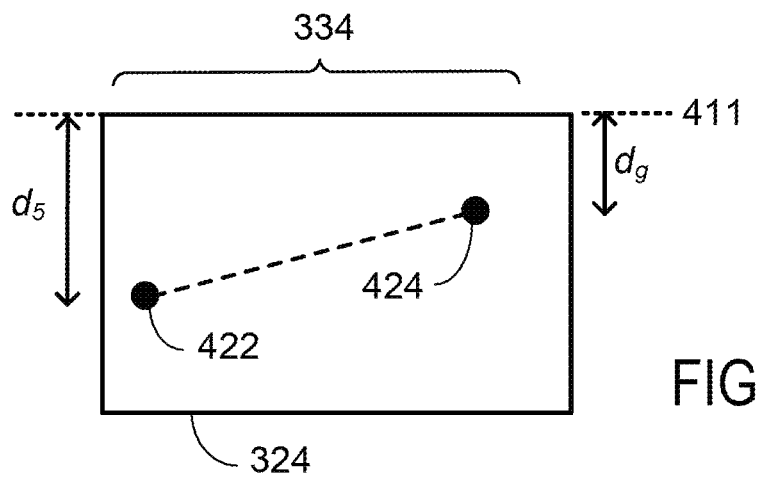

FIG. 4C illustrates a top down view of optical layers of the optical stack. Referring to FIG. 4C, a top down view of the third optical layer 324 is shown including the third pair 334 of fiducial marks. A first fiducial mark 422 of the third pair 332 is spaced a distance $d_5$ from a reference line 421 and a second fiducial mark 424 of the third pair 334 is spaced a distance $d_6$ from the reference line 421. In some embodiments, each of the reference lines 401, 411, 421 denote a common reference line. That is, each of the reference lines 401, 411, 421 is in a same position (overlapping) relative to each other when the optical layers 320, 322, 324 are stacked. In some embodiments, there may be a single reference line against which all layers are measured. Such a reference line may be disposed on one of the layers in the optical stack, a separate cover glass layer disposed on the front or back of the optical stack, or any other calibration component that is visible to the system 300 while aligning or qualifying the optical stack. Additionally, the reference line may be a line directly detectable by a camera or microscope during alignment or qualifying of the optical stack, or may be a line inferred by a processor from two or more reference fiducial marks.

Eyepiece Layer

Figure 4D:
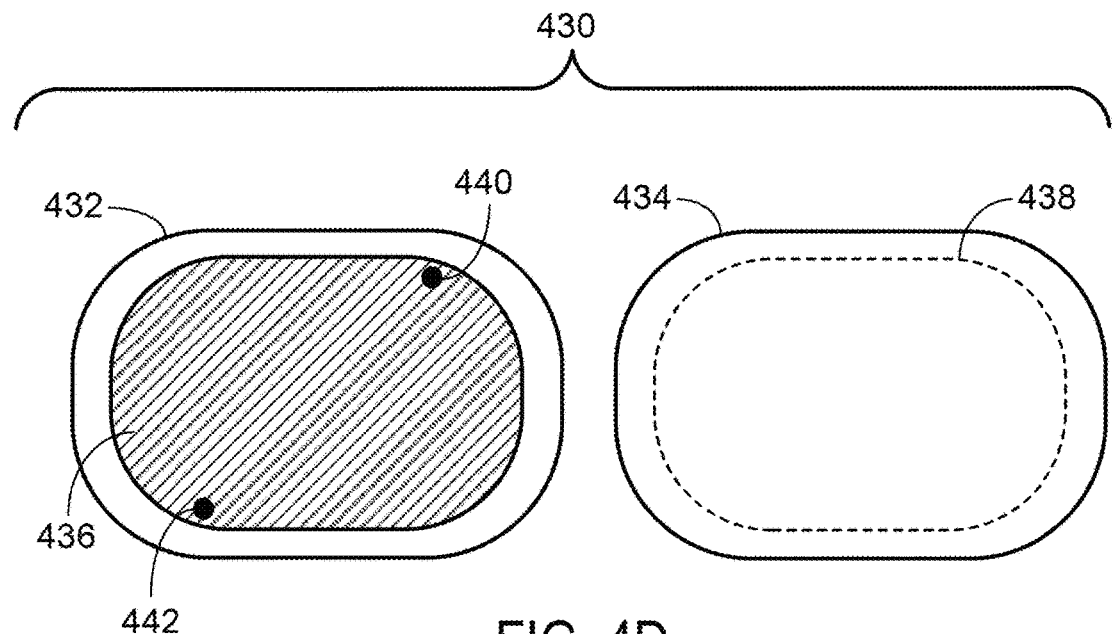
FIGS. 4D, 4E illustrate an eyepiece layer.

FIG. 4D illustrates an eyepiece layer. In some embodiments, fiducial marks can be disposed in locations on the eyepiece layers that overlap optically active areas. For example, referring to FIG. 4D, a first side 432 and a second side 434 of an eyepiece layer 430 are shown. The eyepiece layer 430 includes a diffraction grating 436 on the first side 432 and an outline 438 of the diffraction grating 432 is shown on the second side 434. Two fiducial marks 440, 442 are shown disposed on or within the diffraction grating 436 on the first side 432.

Figure 4E:
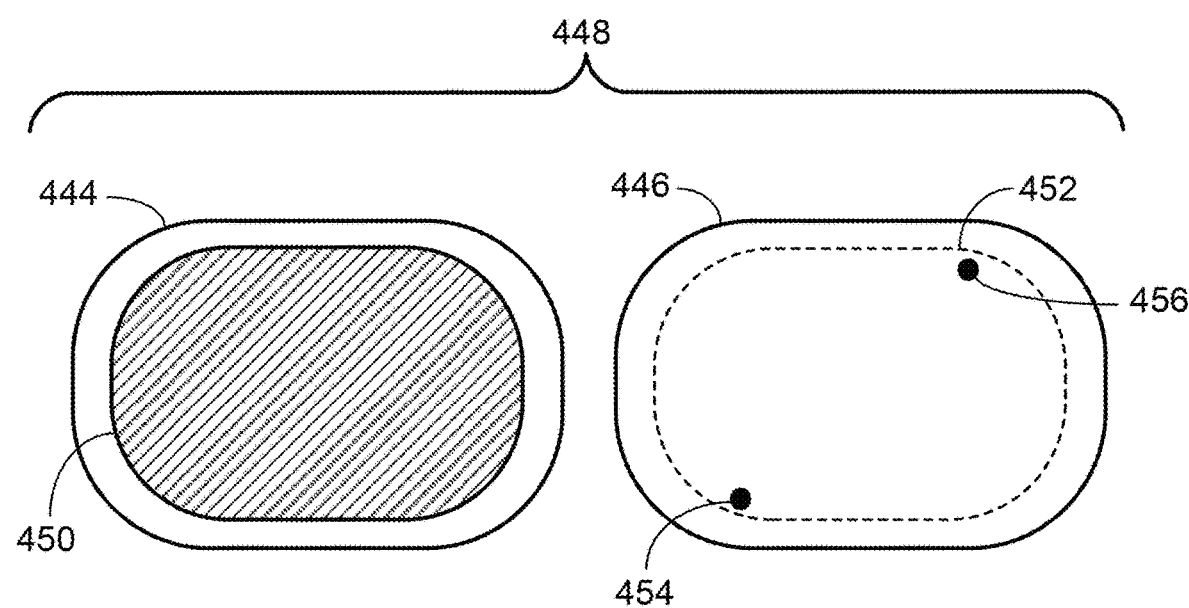

FIG. 4E illustrates an eyepiece layer. In some embodiments, one or more fiducial marks can be disposed on an opposite side of the eyepiece layer to an optically active diffraction grating and can overlap the optically active diffraction grating such that the one or more fiducial marks are visible by a camera looking through the diffraction grating. Referring to FIG. 4E, a first side 444 and a second side 446 of an eyepiece layer 448 are shown. The eyepiece layer 448 includes a diffraction grating 450 on the first side 444 and an outline 452 of the diffraction grating 450 is shown on the second side 446. Two fiducial marks 454, 456 are shown disposed on the second side 446 opposite the first side 444 having the diffraction grating 450. The two fiducial marks 454, 456 may be disposed within the outline 452 representing the area that the diffraction grating 450 occupies on the first side 444. In the embodiments shown in FIGS. 4D, 4E, the fiducial marks overlap the diffraction gratings. In such embodiments, the diffraction gratings may include an orthogonal pupil expander (OPE), an exit pupil expander (EPE), a multidirectional pupil expander (MPE), or any other type of diffraction grating.

Optical Stack Denoting Reference Lines

Figure 5:
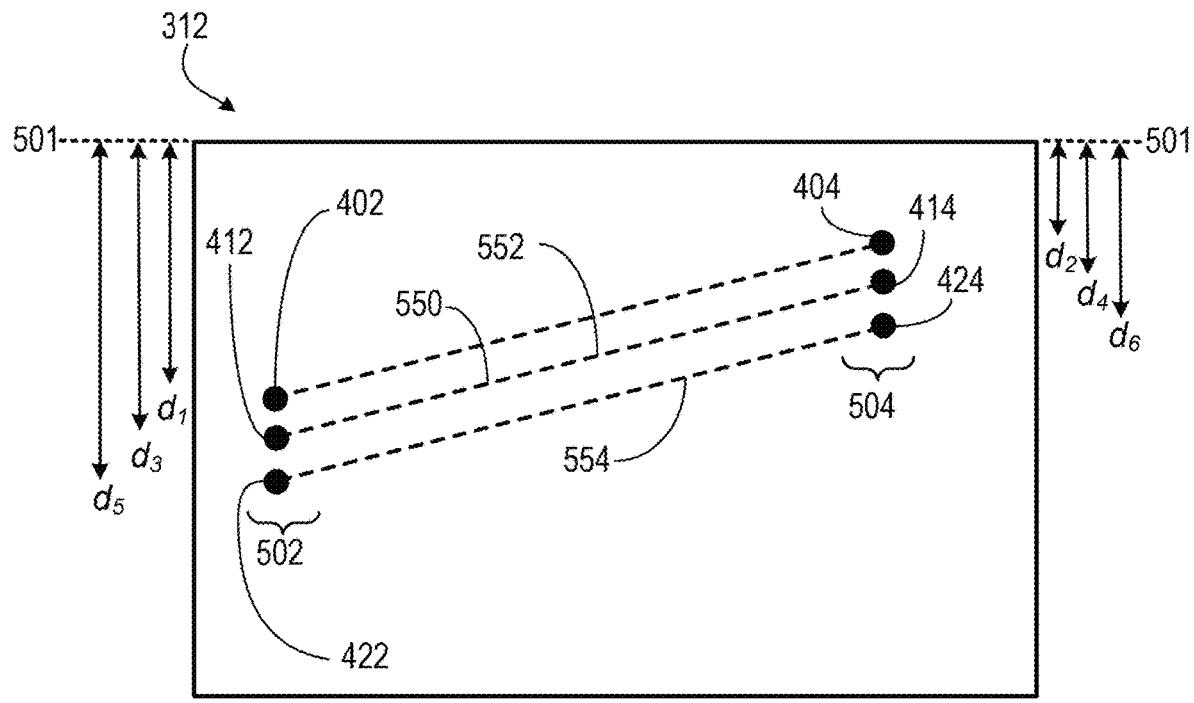
FIG. 5 illustrates a top down view of the optical stack denoting reference lines between pairs of fiducial marks of the optical layers.

FIG. 5 illustrates a top down view of an optical stack denoting reference lines between pairs of fiducial marks of the optical layers. Referring to FIG. 5, a top view of the optical structure 312 including each of the optical layers 320, 322, 324 is shown. A first grouping 502 of fiducial marks can include first fiducial marks 402, 412, 422. A second group 504 of fiducial marks can include second fiducial marks 404, 414, and 424. A reference line 501 can represent each of the reference lines 401, 411, 421 of FIGS. 4A, 4B, 4C.

As illustrated, the distances of each of the fiducial marks of the first grouping 502 of fiducial marks can differ—specifically, the distance $d_5$ of the first fiducial mark 422 is greater than the distance $d_3$ of the first fiducial mark 412, and the distance $d_3$ of the first fiducial mark 412 is greater than the distance $d_1$ of the first fiducial mark 402. Similarly, the distances of each of the fiducial marks of the second grouping 504 of fiducial marks can differ—specifically, the distance $d_6$ of the second fiducial mark 424 is greater than the distance $d_4$ of the second fiducial mark 414, and the distance $d_4$ of the second fiducial mark 414 is greater than the distance $d_2$ of the second fiducial mark 404. While the distances separating the fiducial marks are shown in FIGS. 4A-4C to be substantially constant, a different spacing between the fiducial marks may be used. One of skill in the art will appreciate that the amount of open area available on each layer of an optical stack may be a factor in deciding where fiducial marks are located.

Referring to FIGS. 4A, 4B and 5, each of the first pair 330 of fiducial marks is spaced laterally from each other second pair 332 of fiducial marks such that all of the first pair 330 of fiducial marks and the second pair 332 of fiducial marks are visible through the optical stack 312. In some embodiments, the first pair 330 and the second pair 332 of fiducial marks are non-overlapping along a direction transverse to a plane defined by the first optical layer 320. In other words, the first pair 330 and the second pair 332 do not overlap along the direction transverse to the plane defined by the first optical layer 320. For example, as shown in FIG. 3, the direction p from the microscope 304 extends through the optical stack 312 to the light source 302. Similarly, referring back to FIGS. 4A, 4C, and 5, each of the first pair 330 of fiducial marks is spaced laterally from each other third pair 334 of fiducial marks such that all of the first pair 330 of fiducial marks and the third pair 334 of fiducial marks are visible through the optical stack 312.

Referring back to FIGS. 4B, 4C, and 5, each of the second pair 332 of fiducial marks is spaced laterally from each other third pair 334 of fiducial marks such that all of the second pair 332 of fiducial marks and the third pair 334 of fiducial marks are visible through the optical stack 312. More specifically, referring to FIGS. 3 and 5, as each of the distances $d_1$, $d_3$, and $d_5$ differ, each of the first fiducial marks 402, 412, 422 of the first group 502 are spaced laterally from each other such that each of the first fiducial marks 402, 412, 422 are visible through the optical stack 312, and are non-overlapping along the direction p. Similarly, as each of the distances $d_2$, $d_4$, and $d_6$ differ each of the second fiducial marks 404, 414, 424 of the second group 504 are spaced laterally from each other such that each of the second fiducial marks 404, 414, 424 are visible though the optical stack 312, and are non-overlapping along the direction p.

Additionally, while the first grouping 502 of fiducial marks 402, 412, 422 and the second grouping 504 of fiducial marks 404, 414, 424 are shown to vary in position along a single axis in a direction orthogonal to the reference line 501, the position of one or more of the fiducial marks may vary along one or more axis. For example, if the position of a first fiducial mark is assigned a coordinate location $(x_1, y_1)$, a position of a second fiducial mark may be at a coordinate location $(x_2, y_2)$.

In some implementations, the processor 306 is configured to perform operations based on the detection of the pairs 330, 332, 334 of fiducial marks. Specifically, referring to FIGS. 3 and 5, the processor 304 determines a first reference line 550 defined between the first pair 330 of fiducial marks (fiducial marks 402 and 404), and connecting the first pair 330 of fiducial marks. Similarly, the processor 304 determines a second reference line 552 defined between the second pair 332 of fiducial marks (fiducial marks 412 and 414), and connecting the second pair 332 of fiducial marks. Also similarly, the processor 304 determines a third reference line 553 defined between the third pair 334 of fiducial marks (fiducial marks 422 and 424), and connecting the third pair 334 of fiducial marks.

Optical Stack Denoting Angles Between Reference Lines and Global Reference Line

Figure 6:
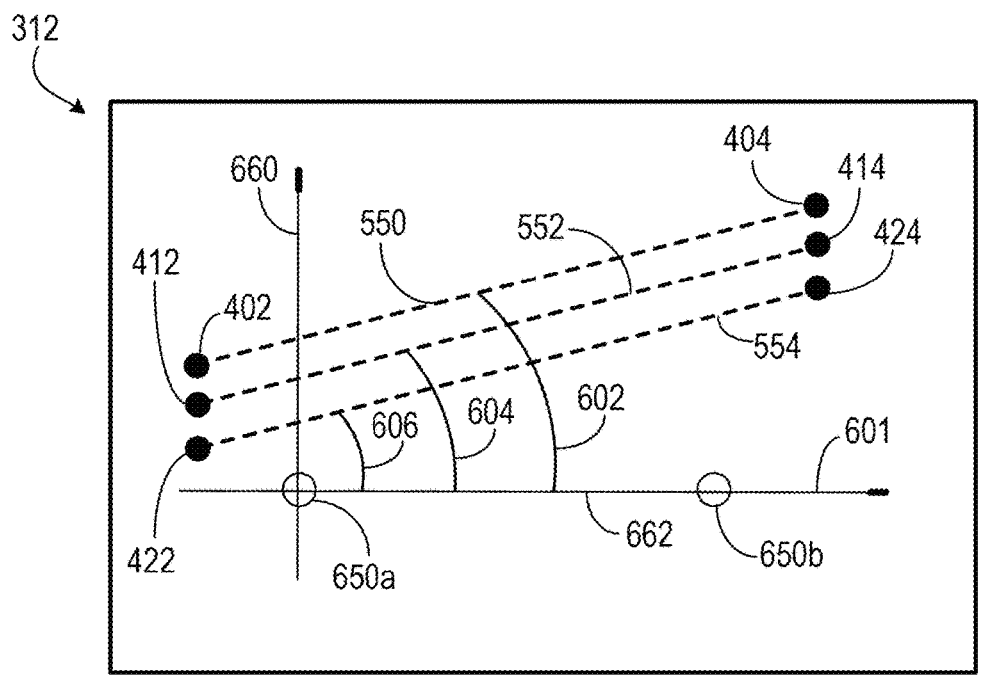
FIG. 6 illustrates a top down view of the optical stack denoting angles between the reference lines and a global reference line.

FIG. 6 illustrates a top down view of the optical stack denoting angles between the reference lines and a global reference line. The processor 306 is further configured to determine angles defined between each of the reference lines and a global reference line. In some embodiments a first angle 602 defined between a first reference line 550 connecting the first pair 330 of fiducial marks and a global reference line 601 is determined. A second angle 604 defined between a second reference line 552 connecting the second pair 332 of fiducial marks and the global reference line 601. The first angle 602 is compared with the second angle 604.

In some embodiments, the processor determines whether a difference between the first angle 602 and the second angle 604 is less than a predetermined threshold. In some embodiments, the predetermined threshold is related to specifications of a particular nano-fabrication technology. For example, a predetermined threshold of $\theta \leq 0.1$ can be used. In other embodiments, a different predetermined threshold can be used, depending on factors such as a design margin of the field of view, a tolerance to unalignment of structures of the multi-layered optical stack 312 to external input devices (e.g., the light source 302), or mechanical constraints affecting edges of the optical layers.

The processor qualifies the multi-layered optical stack 312 for use in the optical projection system responsive to the difference between the first angle 602 and the second angle 604 being less than the predetermined threshold. For example, the multi-layered optical stack 312 is qualified for use based on whether a difference between the first angle 602 and the second angle 604 is less than a predetermined threshold. Referring to FIGS. 3 and 6, the processor 306 determines a first angle 602 defined between the first reference line 550 and the global reference line 601. Similarly, the processor 306 determines a second angle 604 defined between the second reference line 552 and the global reference line 601. In some embodiments, a third angle defined between a third reference line connecting the third pair 334 of fiducial marks and the global reference line 601 is determined. For example, the processor 306 determines a third angle 606 defined between the third reference line 553 and the global reference line 601.

The processor 306 is further configured to compare any of the determined angles to each other or to a predetermined ideal angle that is known from the designed location of fiducial marks on each layer. In some embodiments, the processor 306 compares the first angle 602 with the second angle 604. The processor 306 is further configured to qualify the optical stack 312 for use in an optical projection system, e.g., the system 100, based on whether a difference between the first angle 602 and the second angle 604 is within a predetermined range of angles. In embodiments where the first angle 602 and the second angle 604 are equal when the first and second layers are perfectly aligned, the processor 306 may be configured to qualify the optical stack for use in an optical projection system when a difference between the first angle 602 and the second angle 604 is within a predetermined range, or less than a predetermined threshold. In some embodiments, the predetermined range is related to specifications of a particular nano-fabrication technology. For example, a predetermined range of between 0.1 degrees and −0.1 degrees can be used. In other embodiments, a different predetermined range can be used, depending on factors such as a design margin of the field of view, a tolerance to an unalignment of structures of the multi-layered optical stack 312 to external input devices (e.g., the light source 302), or mechanical constraints affecting edges of the optical layers.

In some embodiments, the processor 306 determines that the first optical layer 320 and the second optical layer 322 are rotationally aligned responsive to a difference between the first angle 602 and the second angle 604 being less than a predetermined threshold. The processor 306 qualifies the multi-layered optical stack 312 for use in the optical projection system responsive to determining that the first optical layer 320 and the second optical layer 322 are rotationally aligned. For example, the processor 306 can determine that the first optical layer 320 and the second optical layer 322 are rotationally aligned, based on comparing the first angle 602 with the second angle 604, when the difference between the first angle 602 and the second angle 604 is within the predetermined range, or less than a predetermined threshold, or the first angle 602 is substantially the same as the second angle 604. In response to determining that the first optical layer 320 and the second optical layer 322 are rotationally aligned, the processor 306 qualifies the optical stack 312 for use in the optical projection system.

In some embodiments, qualifying the optical stack 312 for use in the optical projection system further includes providing alignment information of the layers 320, 322 (e.g., based on the difference between the first angle 602 and the second angle 604) to the optical projection system. Such alignment information can facilitate alignment of other optical layers of other optical stacks that can be subsequently processed by the optical projection system. That is, the optical projection system can provide a desired alignment between optical layers of subsequently processed optical stacks based on the alignment information obtained from the layers 320, 322 of the stack 312, and in particular, based on the angle difference between the angles 602, 604 of the layers 320, 322.

In some embodiments, the processor 306 determines whether a difference between any two of the first angle 602, the second angle 604, and the third angle 606 is less than the predetermined threshold. For example, referring to FIG. 6, the processor 306 is configured to compare the first angle 602, the second angle 604, and the third angle 606. The processor 306 is further configured to qualify the optical stack 312 for use in the optical projection system, e.g., the system 100, based on whether a difference between any two of the first angle 602, the second angle 604, and the third angle 606 is within the predetermined range, or less than a predetermined threshold. For example, the processor 306, based on comparing the first angle 602, the second angle 604, and the third angle 606 can determine that the first optical layer 320, the second optical layer 322, and the third optical layer 324 are rotationally aligned when the difference between any two of the first angle 602, the second angle 604, and the third angle 606 is within the predetermined range, or less than the predetermined threshold. In response to determining that the first optical layer 320, the second optical layer 322, and the third optical layer 324 are rotationally aligned, the optical stack 312 is qualified for use in the optical projection system. In some embodiments, it may be advantageous to select a single angle, for example, the first angle 602, to use as a reference for comparing the angles of all other layers to, for example the second angle 604 or the third angle 606.

In some embodiments, qualifying the optical stack 312 for use in the optical projection system further includes providing alignment information of the layers 320, 322, 324 (e.g., based on a difference between any two of the first angle 602, the second angle 604, and the third angle 606) to the optical projection system. Such alignment information can facilitate alignment of other optical layers of other optical stacks that can be subsequently processed by the optical projection system. That is, the optical projection system can provide a desired alignment between optical layers of subsequently processed optical stacks based on the alignment information obtained from the layers 320, 322, 324 of the stack 312, and in particular, based on an angular difference between any two of the angles 602, 604, 606 of the layers 320, 322, 324.

In some embodiments, the processor 306 terminates the qualifying of the multi-layered optical stack 312 responsive to a difference between any two of the first angle 602, the second angle 604, and the third angle 606 being greater than the predetermined threshold. For example, the processor 306, based on comparing the angles 602, 604, 606, determines that a difference between any two of the first angle 602, the second angle 604, and the third angle 606 is greater than the predetermined threshold. In response to the difference between the first angle 602, the second angle 604, and the third angle 606 being outside the predetermined range, or greater than the predetermined threshold, the processor 306 terminates further processing of the optical stack 312 for use in the optical projection system, e.g., the system 100. That is, the processor 306, based on comparing the first angle 602, the second angle 604, and the third angle 606 can determine that the first optical layer 320 and the third optical layer 324 are rotationally unaligned when the difference between the first angle 602 and the third angle 606 is outside the predetermined range, or greater than the predetermined threshold. In response to determining that the first optical layer 320 and the third optical layer 326 are rotational unaligned, further processing of the optical stack 312 for use in the optical projection system is terminated.

In some embodiments, referring to FIG. 6, the optical stack 312 further includes the global fiducial marks 650a, 650b (collectively referred to as global fiducial marks 650). The processor 306 determines a respective position of each fiducial mark 402, 404 of the first pair 330 of fiducial marks along a first axis and a second axis. The second axis is orthogonal to the first axis. For example, the global fiducial marks 650 define a first axis 660 and a second axis 662. The second axis 662 is orthogonal to the first axis 660.

In some embodiments, the processor 306 compares i) a first position of a first fiducial mark of the first pair 330 of fiducial marks along the first axis 660 and the second axis 662 to a first expected position of the first fiducial mark of the first pair 330 along the first axis 660 and the second axis 662, respectively, and ii) a second position of a second fiducial mark of the first pair 330 along the first axis 660 and the second axis 662 to a second expected position of the second fiducial mark of the first pair 330 along the first axis 660 and the second axis 662, respectively. For example, the processor 306 determines a position of each fiducial mark 402, 404 of the first pair 330 along the first axis 660 and the second axis 660. The processor 306 compares the position of the first fiducial mark 402 of the first pair 330 along the first axis 660 and the second axis 662 to an expected positon of the first fiducial mark 402 along the first axis 660 and the second axis 662. Similarly, the processor 306 compares the position of the second fiducial mark 404 of the first pair 330 along the first axis 660 and the second axis 662 to an expected positon of the second fiducial mark 404 along the first axis 660 and the second axis 662. The expected positions of the fiducial marks 402, 404 along the axes 660, 662 can be based on processing conditions, e.g., of the system 100, and/or provided by a user operating the system 100.

In some embodiments the processor 306 determines whether the first optical layer 320 is translationally aligned responsive to a difference between the respective position of each fiducial mark of the first pair 330 along each axis being less than a threshold difference with respect to the respective expected position of each fiducial mark of the first pair 330 along each axis. In some embodiments, the threshold difference is related to specifications of a particular nano-fabrication technology. For example, a threshold difference of between −10 μm and 10 μm can be used. In other embodiments, a different threshold difference can be used, depending on factors such as a tolerance to unalignment of structures of the multi-layered optical stack 312 to external input devices (e.g., the light source 302) or mechanical constraints affecting edges of the optical layers.

The processor 306 qualifies the multi-layered optical stack 312 responsive to determining that the first optical layer 320 is translationally aligned. For example, the processor 306 determines, based on the comparing, that the first optical layer 320 is translationally aligned when a difference between the position of the fiducial marks 402, 404 along each axis 660, 662 is less than a threshold difference with respect to the respective expected position of the fiducial marks 402, 404 along each axis 660, 662. That is, the processor 305 compares i) the position of the first fiducial mark 402 along the axes 660, 662 to an expected position of the first fiducial mark 402 along the axes 660, 662; and compares ii) the position of the second fiducial mark 404 along the axes 660, 662 to an expected position of the second fiducial mark 404 along the axes 660, 662. The processor 306, in response to determining that the first optical layer 320 is translationally and rotationally aligned, qualifies the optical stack 312 for use in the optical projection system, e.g., the system 100. However, a desired translational alignment can be determined of any of the layers 320, 322, 324.

Optical Stack Displaying Unaligned Optical Layers

Figure 7:
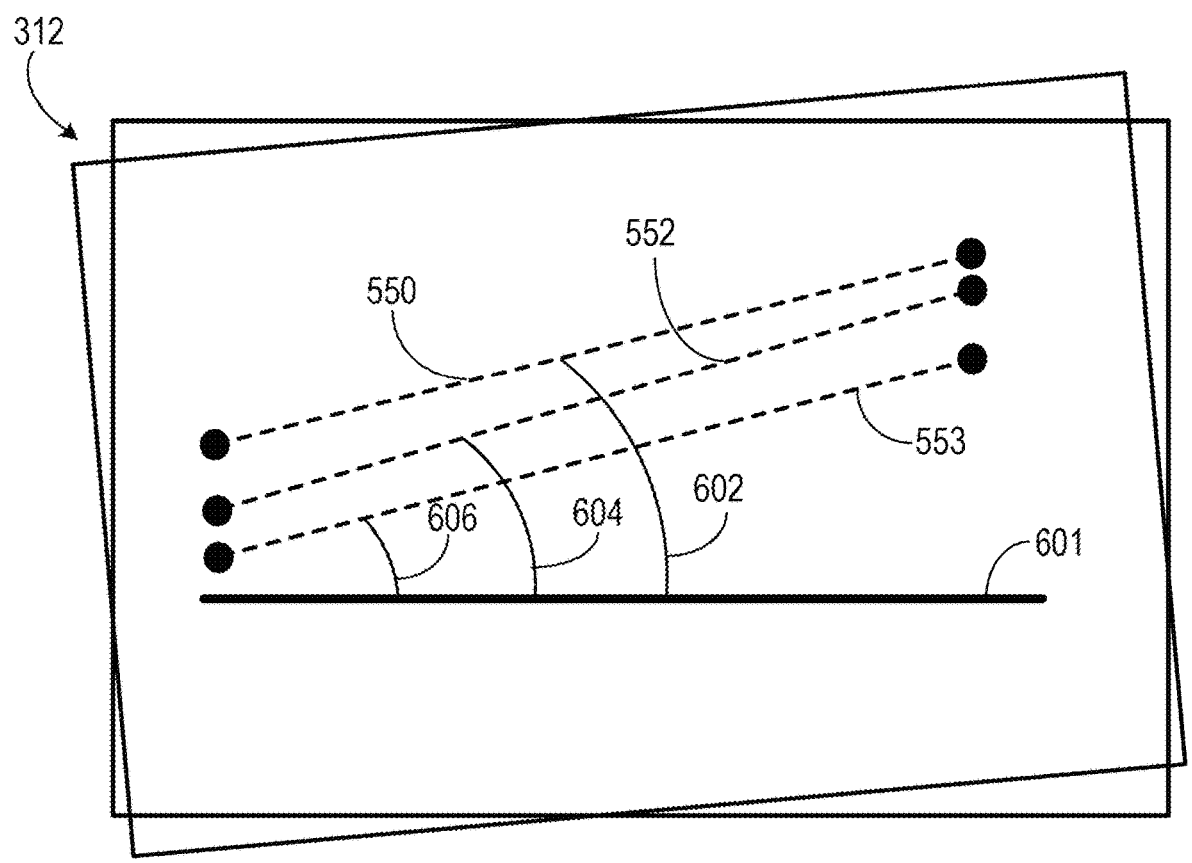
FIG. 7 illustrates a top down view of the optical stack displaying unaligned optical layers.

FIG. 7 illustrates a top down view of the optical stack displaying unaligned optical layers. In some embodiments, the processor 305 terminates the qualifying of the multi-layered optical stack 312 for use in the optical projection system responsive to the difference between the first angle 602 and the second angle 604 being greater than the predetermined threshold. Referring to FIG. 7, the processor 306, based on comparing the first angle 602 with the second angle 604, determines whether a difference between the first angle 602 and the second angle 604 is greater than the predetermined threshold or outside of a predetermined range of acceptable angles. In response to the difference between the first angle 602 and the second angle 604 being outside the predetermined range, or greater than the predetermined threshold, the processor 306 terminates further processing of the optical stack 312 for use in the optical projection system, e.g., the system 100.

In some embodiments, the processor 306 determines that the first optical layer 320 and the second optical layer 322 are rotationally unaligned responsive to the difference between the first angle 602 and the second angle 604 being greater than the predetermined threshold. That is, the processor 306, based on comparing the first angle 602 with the second angle 604, can determine that the first optical layer 320 and the second optical layer 322 are rotationally unaligned when the difference between the first angle 602 and the second angle 604 is outside the predetermined range, or greater than the predetermined threshold, or the first angle 602 substantially differs from the second angle 604. In response to determining that the first optical layer 320 and the second optical layer 322 are rotationally unaligned, qualification of the optical stack 312 for use in the optical projection system is terminated. In some examples, terminating the qualification of the optical stack 312 can include quarantining the optical stack 312 and/or scrapping the optical stack 312.

Optical Layers Including Triplets of Fiducial Marks

Figure 8:
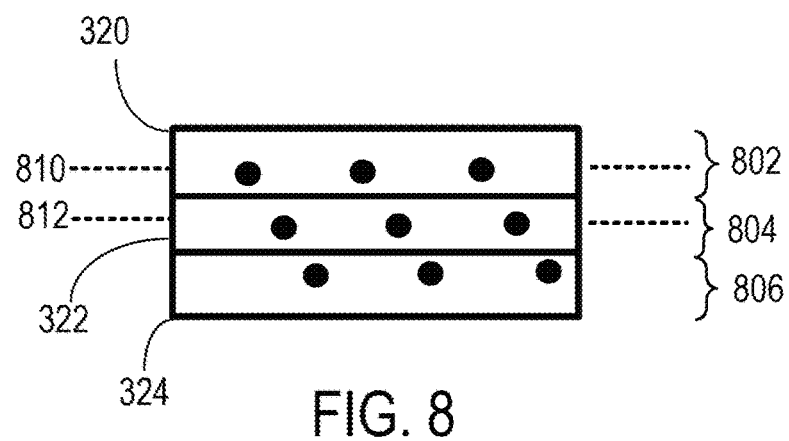
FIG. 8 illustrates a side view of the optical stack, with the optical layers including triplets of fiducial marks.

FIG. 8 illustrates a side view of the optical stack, with the optical layers including triplets of fiducial marks. In some embodiments, the first optical layer 320 includes a first triplet of fiducial marks and the second optical layer 322 includes a second triplet of fiducial marks. The first triplet includes the first pair 330 of fiducial marks and the second triplet includes the second pair 332 of fiducial marks. For example, the layers 320, 322, 324 include triplets of fiducial marks. Specifically, the first optical layer 320 can include a first triplet 802 of fiducial marks, the second optical layer 322 can include a second triplet 804 of fiducial marks, and the third optical layer 324 can include a third triplet 806 of fiducial marks.

In some embodiments, the processor 306 determines a first plane defined by the first optical layer 320 based on the first triplet 802 of fiducial marks, and ii) a second plane defined by the second optical 322 layer based on the second triplet 804 of fiducial marks. For example, the processor 306 is configured to determine (calculate) a first plane 810 of the first optical layer 320 using the first triplet 802 of fiducial marks and the designed location of each fiducial mark in the first triplet 802. Similarly, the processor 306 determines a second plane 812 of the second optical layer 322 using the second triplet 804 of fiducial marks and the designed location of each fiducial mark in the second triplet 804.

In some embodiments, the processor 306 determines a distance between the first plane 801 and the second plane 812 at a plurality of points between the first plane 810 and the second plane 812. For example, the processor 306 can compare a distance between the first plane 810 and the second plane 812 at a plurality of points between the first plane 810 and the second plane 812. In other words, the processor 306 can determine a plurality of distances between the first plane 810 and the second plane 812 at a plurality of points.

In some embodiments, the processor 306 determines that the first optical layer 320 is substantially parallel to the second optical layer 322 responsive to the distance between the first plane 810 and the second plane 812 being substantially the same at a threshold number of points. For example, the processor 306 determines that the distance between the first plane 810 and the second plane 812 is substantially the same (or within a tolerance) at a threshold number of points. In response to determining that the distance between the first plane 810 and the second plane 812 is substantially the same (or within a tolerance) at a threshold number of points, the processor 306 determines that the first optical layer 330 is substantially parallel to the second optical layer 332. In some examples, the distance is an average distance between the first plane 810 and the second plane 812. In some embodiments, the threshold number of points is related to specifications of a particular nano-fabrication technology. For example, a threshold number of points of between 3 and 100 can be used. In other embodiments, a different threshold number of points can be used, depending on factors such as required parallelism control, sensitivity of the multi-layered optical stack 312 to layer planarity, or a stiffness of material of the optical layers.

Example Process for Qualifying Multi-Layered Optical Stack

FIG. 9 illustrates an example process 900 for qualifying a multi-layered optical stack 312 for an optical projection system. The process 900 is illustrated as a collection of referenced acts arranged in a logical flow graph. The order in which the acts are described is not intended to be construed as a limitation, and any number of the described acts can be combined in other orders and/or in parallel to implement the process 900.

The system 300 provides 904 a multi-layered optical stack 312 using the processor 306. In some embodiments, the optical stack 312 includes the first optical layer 320 and the second optical layer 322. The first optical layer 320 can include a first pair 330 of fiducial marks and the second optical layer 322 can include a second pair 332 of fiducial marks. Each of the first pair 330 of fiducial marks is spaced laterally from each of the second pair 332 of fiducial marks such that all of the first pair 330 of fiducial marks and the second pair 332 of fiducial marks are visible through the optical stack 312.

The system 300 determines 908 a first angle 602 defined between the first reference line 550 connecting the first pair 330 of fiducial marks and the global reference line 601. The system 300 determines a second angle 604 defined between the second reference line 552 connecting the second pair 332 of fiducial marks and the global reference line 601.

The system 300 compares 912 the first angle 602 with the second angle 604. In some embodiments, the processor 306 determines that the first optical layer 320 and the second optical layer 322 are rotationally aligned responsive to a difference between the first angle 602 and the second angle 604 being less than a predetermined threshold.

The system 300 qualifies 916 the optical stack 312 for use in an optical projection system based on whether a difference between the first angle 602 and the second angle 604 is less than a predetermined threshold. For example, the processor 306 qualifies the optical stack 312 for use in the optical projection system 100, responsive to the difference between the first angle 602 and the second angle 604 being less than the predetermined threshold.

The fiducial mark embodiments described above with respect to qualifying an optical stack for use in an optical projection system may also find application in actively aligning individual layers of the optical stack during eye-piece assembly.

Two Layers of an Optical Stack

Figure 10A:
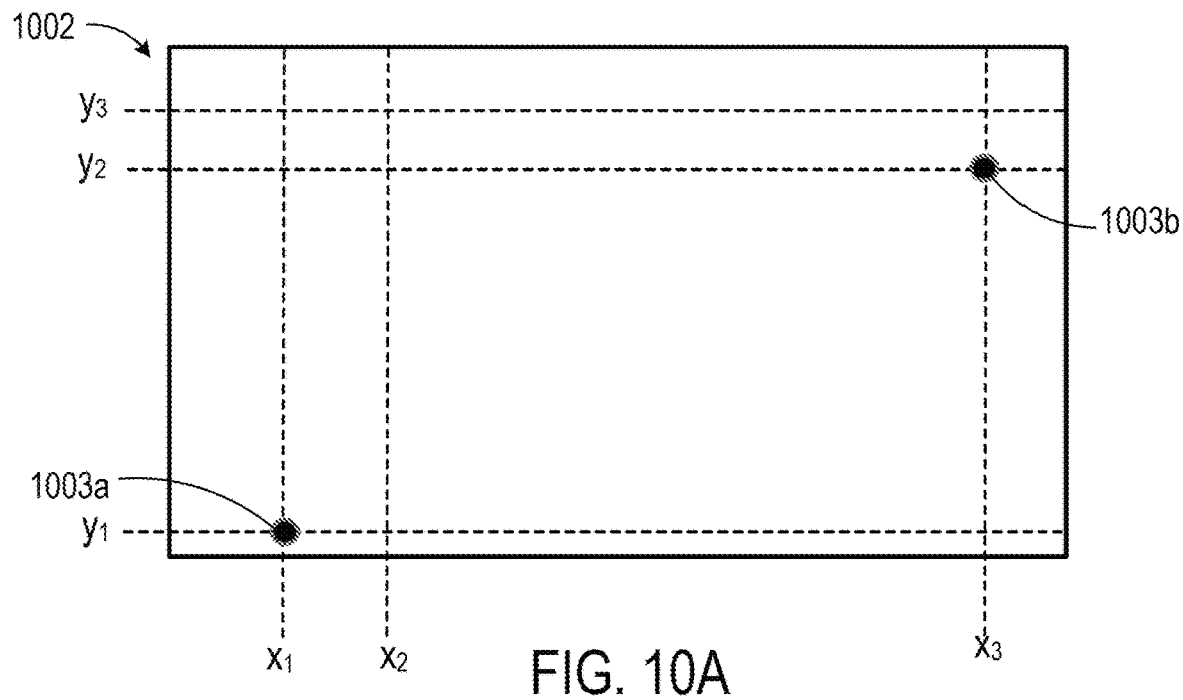
FIGS. 10A, 10B illustrate examples of two layers of an optical stack.
Figure 10B:
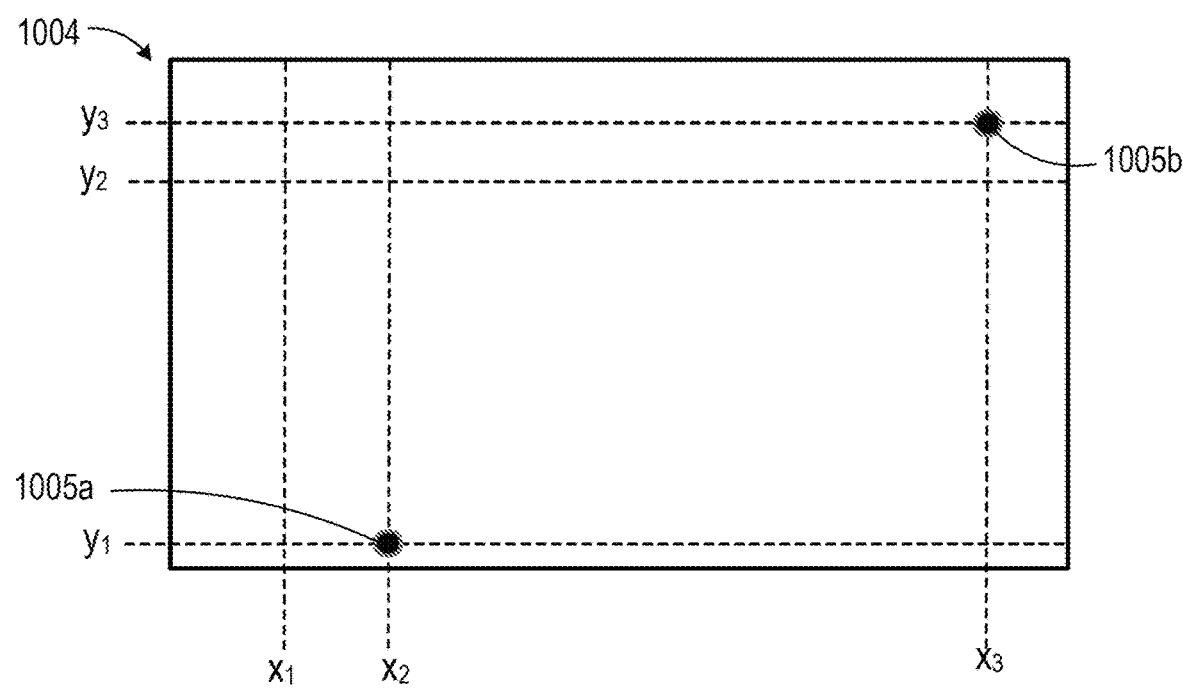

FIGS. 10A and 10B illustrate examples of two layers of an optical stack. Referring to FIGS. 10A and 10B, a first layer 1002 and a second layer 1004 are shown unassembled. The first layer 1002 includes a first set of fiducial marks 1003a, 1003b having coordinates ($x_1$, $y_1$) and ($x_3$, $y_2$), respectively. The second layer 1004 includes a second set of fiducial marks 1005a, 1005b having coordinates ($x_2$, $y_1$) and ($x_3$, $y_3$), respectively. The coordinate frame of reference may be established using an edge of one of the layers or a visible feature on one or more layers, such as an edge of a diffraction grating or a separate set of fiducial marks as discussed above.

Expected Positions of Fiducial Marks

Figure 11:
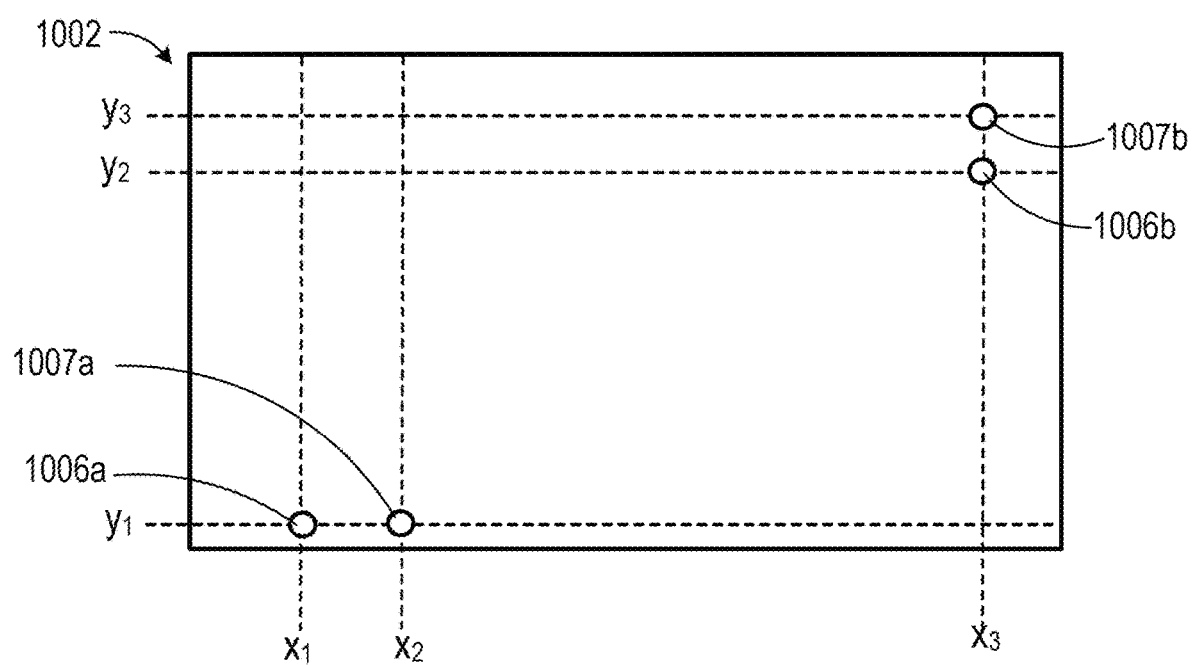
FIG. 11 illustrates an example of expected positions of fiducial marks of an optical stack.

FIG. 11 illustrates an example of expected positions of fiducial marks of an optical stack. With the designed locations of the fiducial marks of each layer known, it is possible to determine where the fiducial marks are expected to appear when the layers are stacked in perfect alignment. An illustration of such expected positions is shown in FIG. 11. Specifically, it is expected that fiducial marks 1003a, 1003b on the first layer 1002 will be located within a tolerance of ($x_1$, $y_1$) and ($x_3$, $y_2$), as indicated by circles 1006a, 1006b, respectively, and that fiducial marks 1005a, 1005b on the second layer 1004 will be located within a tolerance of ($x_2$, $y_1$) and ($x_3$, $y_3$), as indicated by circles 1007a, 1007b, respectively.

Alignment of a First Layer of an Optical Stack

Figure 12:
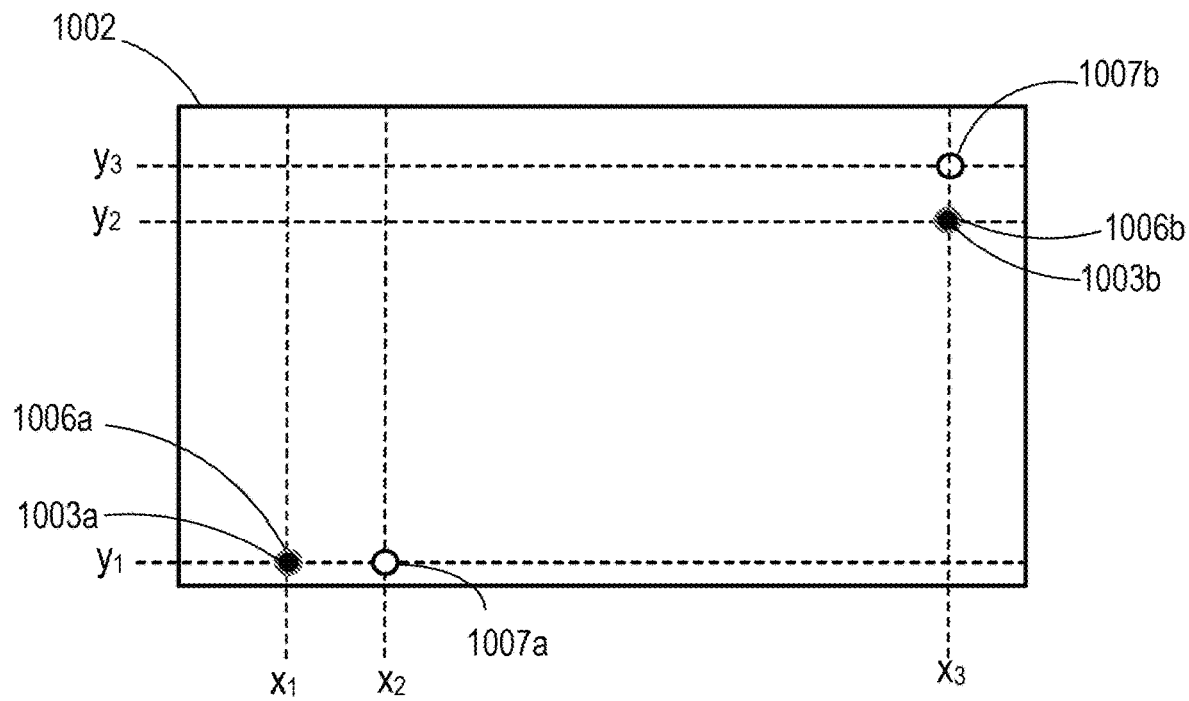
FIG. 12 illustrates alignment of a first layer of an optical stack.

FIG. 12 illustrates alignment of a first layer of an optical stack. Referring to FIG. 12, placement of the first layer 1002 is shown. The first pair of fiducial marks 1003a, 1003b align within the expected tolerance circles 1006a, 1006b as shown and no further adjustment is necessary. In some embodiments, the coordinate system may be established using the first pair of fiducial marks 1003a, 1003b such that the first layer 1002 is the basis for relative alignment measurement of subsequent layers, and in such embodiments, the first layer 1002 may not require adjusting.

Alignment of First and Second Layer of Optical Stack

Figure 13:
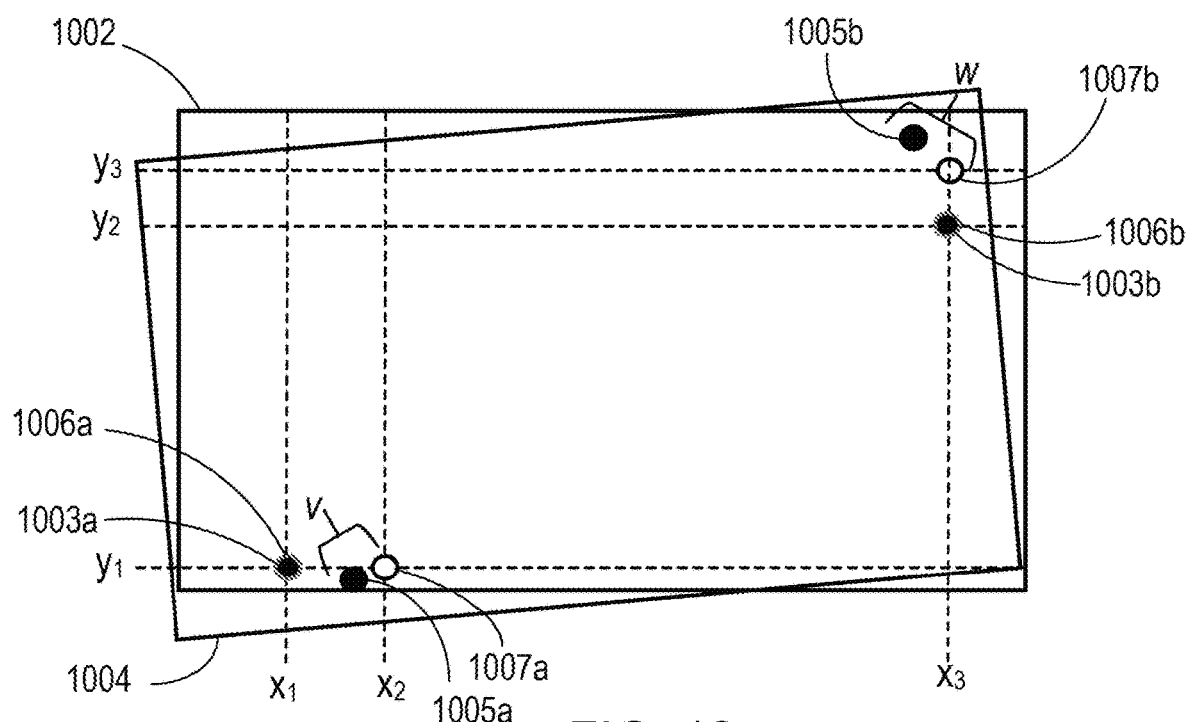
FIG. 13 illustrates alignment of a first and a second layer of an optical stack.

FIG. 13 illustrates alignment of a first and a second layer of an optical stack. The second layer 1004 is brought into the assembly process in gross positioning so that the second set of fiducial marks 1005a, 1005b are visible to an alignment system camera and/or microscope. The locations of the second set of fiducial marks 1005a, 1005b are compared to the expected tolerance circles 1007a, 1007b and, in this case, are found to be outside of the predetermined tolerances. Actual coordinates of the locations of second set of fiducial marks 1005a, 1005b can be determined by a processor of an alignment system. The processor can compare the actual locations to the expected locations and determine a difference in the positions, v, w, for each of the fiducial marks. In determining a positional difference, the processor may also use angle measurements of lines (not shown) that are inferred between the fiducial marks, as discussed above with respect to qualifying optical stacks.

When the positional differences between actual fiducial locations and expected fiducial locations are known, and in some embodiments, when the measured reference line angle and expected reference line angle is known, the process may calculate positional changes to minimize the differences between actual and expected values. Such positional changes may then be sent as instructions to a movable chuck holding the layer undergoing alignment so that the layer is moved closer to an acceptable position with respect to one or more other layers. In this example, FIG. 13 shows that the second layer 1004 has moved with respect to the first layer 1002 such that the second set of fiducial marks 1005a, 1005b are aligned within the expected tolerance circles 1007a, 1007b.

Alignment of First and Second Layer

Figure 14:
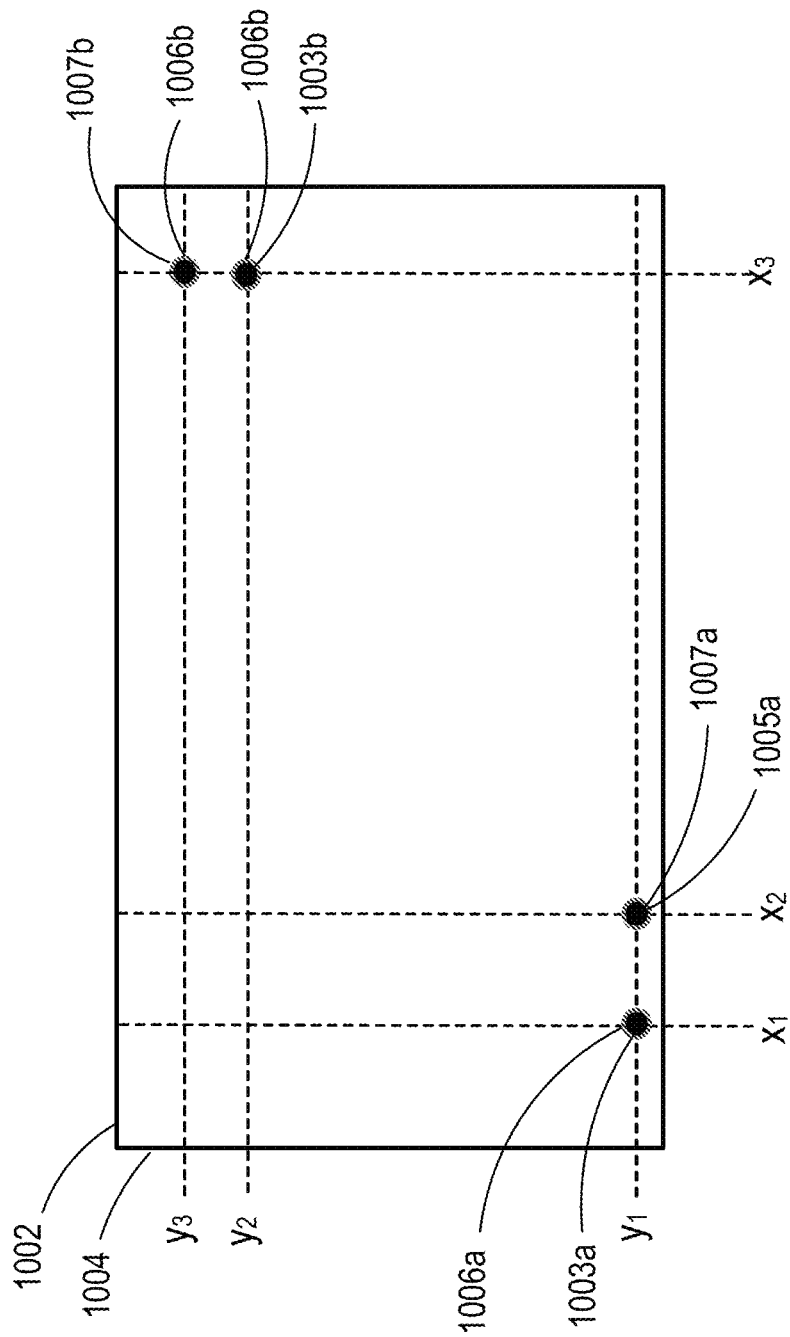
FIG. 14 illustrates alignment of a first and a second layer of an optical stack.

FIG. 14 illustrates alignment of a first and a second layer of an optical stack. One of skill in the art will appreciate that movement of each layer to an acceptable alignment position may require one or more of translational adjustment, rotational adjustment, pitch adjustment and yaw adjustment. Moreover, while alignment of the second layer 1004 was shown in this example to be achieved in a single adjustment, layer alignment may occur after several iterations through the feedback loop that includes the steps of: determining actual fiducial locations, comparing actual fiducial locations to expected fiducial locations, calculating a positional change for the layer being aligned, and adjusting the position of the layer being aligned.

What is claimed is:

1. A method of qualifying a multi-layered optical stack for an optical projection system, the method comprising:
   providing the multi-layered optical stack comprising a first optical layer, a second optical layer, and a third optical layer, the first optical layer comprising a first pair of fiducial marks, the second optical layer comprising a second pair of fiducial marks, and the third optical layer comprising a third pair of fiducial marks, each of the first pair of fiducial marks spaced laterally from each of the second pair of fiducial marks such that the first pair of fiducial marks and the second pair of fiducial marks are visible through the optical stack;
   determining, using a computer processor, i) a first angle defined between a first reference line connecting the first pair of fiducial marks and a global reference line, ii) a second angle defined between a second reference line connecting the second pair of fiducial marks and the global reference line, and iii) a third angle defined between a third reference line connecting the third pair of fiducial marks and the global reference line;
   determining, using the processor, whether a difference between the any two of the first angle, the second angle, and the third angle is less than a predetermined threshold angle; and
   qualifying, using the processor, the multi-layered optical stack for use in the optical projection system responsive to the difference between any two of the first angle, the second angle, and the third angle being less than the predetermined threshold angle.

2. The method of claim 1, wherein the qualifying of the multi-layered optical stack for use in the optical projection system comprises:
   determining, using the processor, that the first optical layer and the second optical layer are rotationally aligned responsive to the difference between the first angle and the second angle being less than the predetermined threshold angle.

3. The method of claim 1, further comprising:
   terminating, using the processor, the qualifying of the multi-layered optical stack responsive to the difference between the first angle and the second angle being greater than the predetermined threshold angle.

4. The method of claim 1, further comprising:
determining, using the processor, that the first optical layer and the second optical layer are rotationally unaligned responsive to the difference between the first angle and the second angle being greater than the predetermined threshold angle; and
terminating, using the processor, the qualifying of the multi-layered optical stack responsive to the determining that the first optical layer and the second optical layer are rotationally unaligned.

5. The method of claim 1, wherein the first pair of fiducial marks and the second pair of fiducial marks are non-overlapping along a direction transverse to a plane defined by the first optical layer.

6. The method of claim 1, wherein the first optical layer and the second optical layer are optically transparent.

7. The method of claim 1, further comprising:
determining, using the processor, a respective position of each fiducial mark of the first pair of fiducial marks along a first axis and a second axis, the second axis orthogonal to the first axis;
comparing, using the processor, i) a first position of a first fiducial mark of the first pair of fiducial marks along the first axis and the second axis to a first expected position of the first fiducial mark of the first pair of fiducial marks along the first axis and the second axis, respectively, and ii) a second position of a second fiducial mark of the first pair of fiducial marks along the first axis and the second axis to a second expected position of the second fiducial mark of the first pair of fiducial marks along the first axis and the second axis, respectively;
based on the comparing, determining, using the processor, whether the first optical layer is translationally aligned responsive to a difference between the respective position of each fiducial mark of the first pair of fiducial marks along each axis being less than a threshold difference with respect to the respective expected position of each fiducial mark of the first pair of fiducial marks along each axis; and
qualifying, using the processor, the multi-layered optical stack responsive to determining that the first optical layer is translationally aligned.

8. The method of claim 1, wherein the first optical layer comprises a first triplet of fiducial marks and the second optical layer comprises a second triplet of fiducial marks, the first triplet comprising the first pair of fiducial marks and the second triplet comprising the second pair of fiducial marks, the method further comprising:
determining, using the processor, i) a first plane defined by the first optical layer based on the first triplet of fiducial marks, and ii) a second plane defined by the second optical layer based on the second triplet of fiducial marks;
determining, using the processor, a distance between the first plane and the second plane at a plurality of points between the first plane and the second plane; and
determining, using the processor, that the first optical layer is substantially parallel to the second optical layer responsive to the distance between the first plane and the second plane being substantially the same at a threshold number of points.

9. The method of claim 1, wherein the qualifying of the multi-layered optical stack for use in the optical projection system comprises:
determining, using the processor, that the first optical layer, the second optical layer, and the third optical layer are rotationally aligned responsive to the difference between any two of the first angle, the second angle, and the third angle being less than the predetermined threshold angle.

10. The method of claim 1, further comprising:
terminating, using the processor, the qualifying of the multi-layered optical stack responsive to the difference between any two of the first angle, the second angle, and the third angle being greater than the predetermined threshold angle.

11. The method of claim 1, further comprising:
determining, using the processor, that the first optical layer and the third optical layer are rotationally unaligned responsive to a difference between the first angle and the third angle being greater than the predetermined threshold angle; and
terminating, using the processor, the qualifying of the multi-layered optical stack responsive to the determining that the first optical layer and the third optical layer are rotationally unaligned.

12. A system for qualifying a multi-layered optical stack for an optical projection system, comprising:
a light source configured to illuminate the multi-layered optical stack comprising a first optical layer and a second optical layer, the first optical layer comprising a first pair of fiducial marks and the second optical layer comprising a second pair of fiducial marks, each of the first pair of fiducial marks spaced laterally from each of the second pair of fiducial marks such that the first pair of fiducial marks and the second pair of fiducial marks are visible through the optical stack;
a microscope configured to detect the first pair of fiducial marks and the second pair of fiducial marks illuminated by the light source; and
a processor configured, based on the detection of the first pair of fiducial marks and the second pair of fiducial marks, to:
determine i) a first angle defined between a first reference line connecting the first pair of fiducial marks and a global reference line, and ii) a second angle defined between a second reference line connecting the second pair of fiducial marks and the global reference line; determine whether a difference between the first angle and the second angle is less than a predetermined threshold angle; and
qualify the multi-layered optical stack for use in the optical projection system responsive to the difference between the first angle and the second angle being less than the predetermined threshold angle,
wherein the processor is further configured to:
determine a respective position of each fiducial mark of the first pair of fiducial marks along a first axis and a second axis, the second axis orthogonal to the first axis;
compare i) a first position of a first fiducial mark of the first pair of fiducial marks along the first axis and the second axis to a first expected position of the first fiducial mark of the first pair of fiducial marks along the first axis and the second axis, respectively, and ii) a second position of a second fiducial mark of the first pair of fiducial marks along the first axis and the second axis to a second expected position of the second fiducial mark of the first pair of fiducial marks along the first axis and the second axis, respectively;
based on the comparing, determine whether the first optical layer is translationally aligned responsive to a difference between the respective position of each fiducial mark of the first pair of fiducial marks along each axis being less than a threshold difference with respect to the respective expected position of each fiducial mark of the first pair of fiducial marks along each axis; and qualify the multi-layered optical stack responsive to determining that the first optical layer is translationally aligned.

13. The system of claim 12, wherein the qualifying of the multi-layered optical stack for use in the optical projection system comprises:

determining that the first optical layer and the second optical layer are rotationally aligned responsive to the difference between the first angle and the second angle being less than the predetermined threshold angle.

14. The system of claim 12, wherein the processor is further configured to:

terminate the qualifying of the multi-layered optical stack responsive to the difference between the first angle and second angle being greater than the predetermined threshold angle.

15. The system of claim 12, wherein the processor is further configured to:

determine that the first optical layer and the second optical layer are rotationally unaligned responsive to the difference between the first angle and the second angle being greater than the predetermined threshold angle; and terminate the qualifying of the multi-layered optical stack responsive to the determining that the first optical layer and the second optical layer are rotationally unaligned.

16. The system of claim 12, wherein the first pair of fiducial marks and the second pair of fiducial marks are non-overlapping along a direction transverse to a plane defined by the first optical layer.

17. The system of claim 12, wherein the first optical layer comprises a first triplet of fiducial marks and the second optical layer comprises a second triplet of fiducial marks, the first triplet comprising the first pair of fiducial marks and the second triplet comprising the second pair of fiducial marks, and wherein the processor is further configured to:

determine i) a first plane defined by the first optical layer based on the first triplet of fiducial marks, and ii) a second plane defined by the second optical layer based on the second triplet of fiducial marks;

determine a distance between the first plane and the second plane at a plurality of points between the first plane and the second plane; and determine that the first optical layer is substantially parallel to the second optical layer responsive to the distance between the first plane and the second plane being substantially the same at a threshold number of points.

18. A multi-layered optical stack qualified for an optical projection system, comprising:

a first optical layer comprising a first pair of fiducial marks;

a second optical layer comprising a second pair of fiducial marks;

a third optical layer comprising a third pair of fiducial marks, each of the first pair of fiducial marks spaced laterally from each of the second pair of fiducial marks such that the first pair of fiducial marks and the second pair of fiducial marks are visible through the optical stack, wherein the multi-layered optical stack is qualified for use in the optical projection system responsive to a difference between any two of a first angle, a second angle, and a third angle being less than a predetermined threshold angle, and wherein the first angle is defined between a first reference line connecting the first pair of fiducial marks and a global reference line, and the second angle is defined between a second reference line connecting the second pair of fiducial marks and the global reference line, and the third angle defined between the third reference line connecting the third pair of fiducial marks and the global reference line.

* * * * *